United States Patent
Fitzsimmons et al.

(10) Patent No.: US 7,180,187 B2
(45) Date of Patent: Feb. 20, 2007

(54) INTERLAYER CONNECTOR FOR PREVENTING DELAMINATION OF SEMICONDUCTOR DEVICE

(75) Inventors: John A. Fitzsimmons, Poughkeepsie, NY (US); Jeffrey P. Gambino, Westford, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 10/710,147

(22) Filed: Jun. 22, 2004

(65) Prior Publication Data

US 2005/0280152 A1   Dec. 22, 2005

(51) Int. Cl.
*H01L 23/48* (2006.01)
(52) U.S. Cl. ........................ 257/750; 257/774
(58) Field of Classification Search ............... 257/750, 257/774
See application file for complete search history.

(56) References Cited

U.S. PATENT DOCUMENTS

| | | | |
|---|---|---|---|
| 6,333,560 B1 | 12/2001 | Uzoh | |
| 6,372,409 B1 * | 4/2002 | Yu | ............................ 430/313 |
| 6,492,262 B2 | 12/2002 | Uzoh | |
| 6,559,543 B1 | 5/2003 | Dunham et al. | |
| 6,613,664 B2 * | 9/2003 | Barth et al. | ................. 438/629 |

OTHER PUBLICATIONS

Brown, Alan S., "Fast Films," IEEE Spectrum Online, http://www.spectrum.ieee.org, May 12, 2003, pp. 1-9.
Lammers, David, "IBM May Drop Low-K Materials for Advanced ICs," EETimes, http://www.eetimes.com/story/OEG20030417S0042, Apr. 17, 2003, pp. 1-2.

* cited by examiner

*Primary Examiner*—Roy Karl Potter
(74) *Attorney, Agent, or Firm*—Lisa U. Jaklitsch; Hoffman, Warnick & D'Alessandro LLC

(57) ABSTRACT

An interlayer connector for preventing delamination of semiconductor layers, and methods of forming the connector are disclosed. The connector includes a first connector head in a first distal layer, a second connector head in a second distal layer and a connector body coupling the first and second connector heads. Each connector head has a dimension greater is size than the connector body such that the layers are securely held together. The interlayer connector may be isolated from current-carrying wiring or provided in the form of a contact via. The interlayer connector provides a mechanical mechanism to prevent layers from delaminating regardless of the materials used. The invention also eliminates the need for white space fill above and below via fill by using the connectors coplanar with the on device wiring.

5 Claims, 5 Drawing Sheets

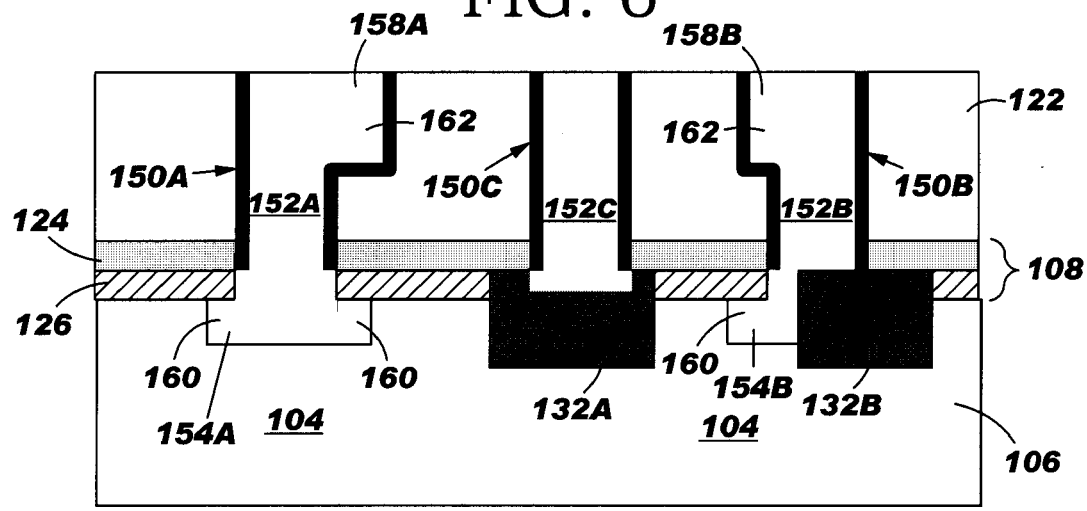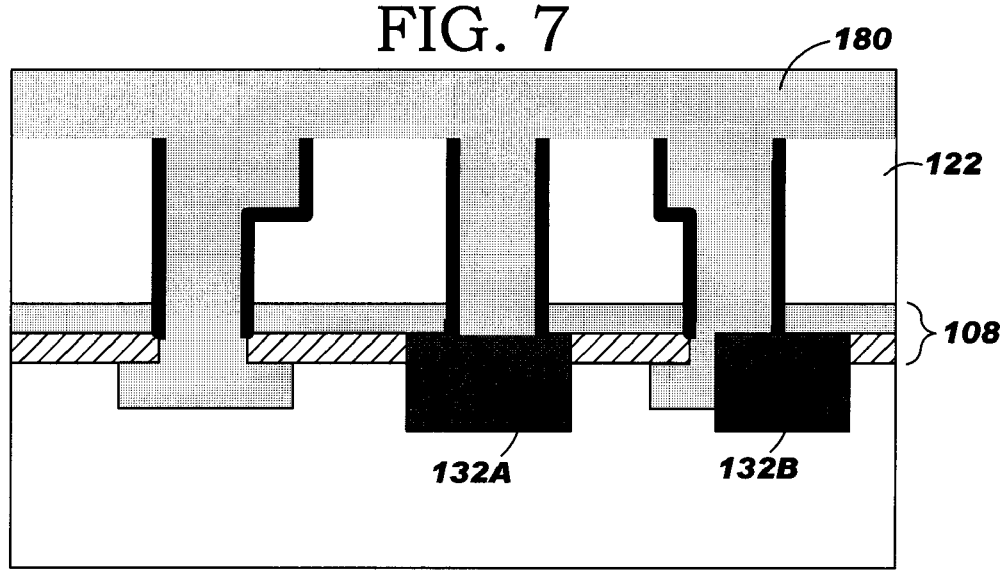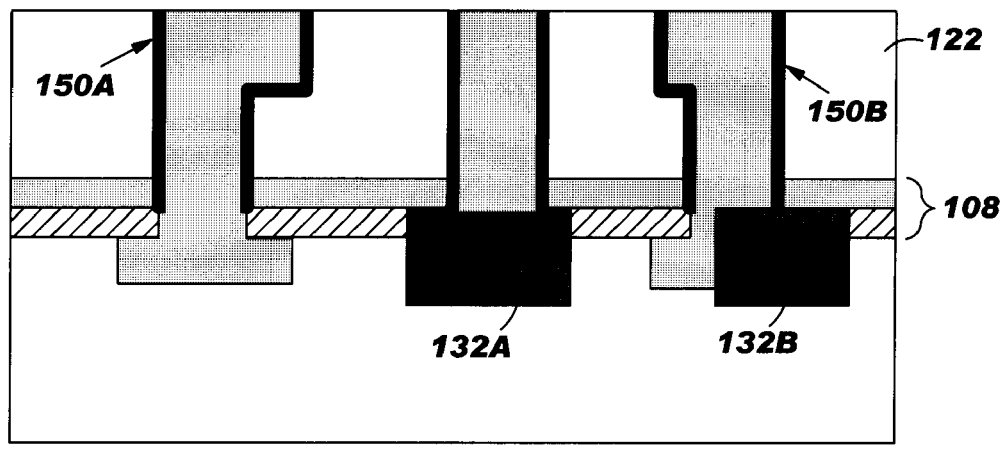

INTERLAYER CONNECTOR FOR PREVENTING DELAMINATION OF SEMICONDUCTOR DEVICE

BACKGROUND OF INVENTION

1. Technical Field

The present invention relates generally to semiconductor devices, and more particularly, to an interlayer connector for preventing delamination of layers of a semiconductor device, and methods of forming the connector.

2. Related Art

Semiconductor fabricators are increasingly facing challenges relative to delamination of layers within a semiconductor device. One reason for the increased significance of this issue is that the industry is currently turning to the use of lower dielectric constant (low-k) dielectric materials to lower capacitances in the continuous pursuit of smaller semiconductor devices. Some of these low-k dielectric materials include SiLK™ from Dow Chemical, Coral™ from Novellus Systems and Black Diamond™ from Applied Materials. Delamination issues arise relative to these materials because they are extremely difficult to integrate with other materials. For example, it is very difficult to attain good adhesion between interfaces of different materials where the materials include a low-k dielectric. The poor adhesion of the new low-k materials is present relative to other dielectrics and metal. As a result of the poor adhesive properties, widespread use of these materials must overcome the delamination problem. Conventionally, adhesion promoters or treatments have been applied to decrease the likelihood that delamination will occur between interfaces. In cases of some of the newer low-k dielectrics, however, this approach does not work.

Another challenge relative to addressing the low-k dielectric material delamination problem is that the semiconductor industry is currently undecided in terms of which type of material will ultimately be favored. For example, the integrated circuit (IC) industry is pursuing parallel paths regarding use of chemical vapor deposited (CVD) materials such as Coral and Black Diamond, and spin-on dielectrics such as SiLK. Each category of material presents its own problems relative to the adhesion/delamination problem. For example, to lower the dielectric constant of CVD materials, carbon has been substituted in the form of methyl groups ($CH_x$) for oxygen in silicon dioxide. However, the carbon addition creates more adhesion problems, and requires more specialized processing. Other low-k materials may not pose this problem, but present other issues relative to delamination. As a result, addressing the delamination problem is difficult because any solution must address the varying challenges of each low-k material that may eventually find widespread use.

Further delamination problems are presented by back-end-of-line (BEOL) low-k dielectrics that have very high coefficient of thermal expansion (CTE) as compared to the on device wiring and substrate. In particular, the CTE mismatch causes yield and reliability problems as the device or wafer is thermally cycled up and down in temperature. For example, devices are stressed at temperature ranges of approximately −150° C. to +150° C. For dielectrics such as polyarylene ether (i.e., SiLK or Flare™ by Honeywell), the stressing has led to catastrophic device fails during stressing due to poor via to wire resistance after stressing (i.e. via opens). One partial solution to this problem has been to add via fill to the existing white space wire fill used on a device. That is, instead of simple wire fill in the white space, providing vias also. With via fill, white-space-fill wire shapes are connected together by vias to connect the wiring layers together and reduce the CTE mismatch induced expansion and contraction during thermal cycling. See, for example, U.S. Pat. No. 6,559,543 to Dunham et al., and assigned to the assignee of the present application, International Business Machines (IBM). One problem with via fill, however, is that it is only usable when white space wire fill shapes are stacked on top of each other, which only occurs on wiring levels with low wiring density. Another problem with via fill is that they are subject to the same stresses as active vias and can de-adhere form underlying metal. Accordingly, this approach finds limited applicability.

In view of the foregoing, there is a need in the art for an improved mechanism to prevent interlayer delamination that addresses the problems of the related art.

SUMMARY OF INVENTION

The invention includes an interlayer connector for preventing delamination of semiconductor layers, and methods of forming the connector. The connector includes a first connector head in a first distal layer, a second connector head in a second distal layer and a connector body coupling the first and second connector heads. Each connector head has a dimension greater is size than the connector body such that the layers are securely held together. The interlayer connector may be isolated from current-carrying wiring or provided in the form of a contact via. The interlayer connector provides a mechanical mechanism to prevent layers from delaminating regardless of the materials used. The invention also eliminates the need for white space fill above and below via fill by using the connectors coplanar with the on device wiring.

A first aspect of the invention is directed to a method of forming an interlayer connector for use in a semiconductor device, the method comprising the steps of: forming at least one opening including: a main body; a first connector head area in a dielectric area of a first distal layer, the first connector head area extending laterally beyond the main body, and a second connector head area in a second distal layer, the second connector head area extending laterally beyond the main body; and filling each opening to form the interlayer connector.

A second aspect of the invention is directed to a method for preventing delamination of at least two layers of a semiconductor device, the method comprising the steps of: forming a first connector head in a dielectric area of a first distal layer of the at least two layers of the semiconductor device; forming a connector body coupled to the first connector head; and forming a second connector head in a second distal layer of the at least two layers of the semiconductor device, the second connector head being coupled to the connector body, wherein the first and second connector head each have a portion that extends laterally beyond the connector body.

A third aspect of the invention is directed to an interlayer connector for preventing delamination of at least two layers of a semiconductor device, the connector comprising: a first connector head located in a dielectric area of a first distal layer of the at least two layers of the semiconductor device; a connector body coupled to the first connector head; and a second connector head coupled to the connector body and located in a second distal layer of the at least two layers of the semiconductor device, the second connector head extending over the connector body.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIGS. 3–6 show a first step of a method for forming the interlayer connectors of FIG. 1.

FIGS. 7–8 show a second step of the method.

DETAILED DESCRIPTION

Figure 1A:
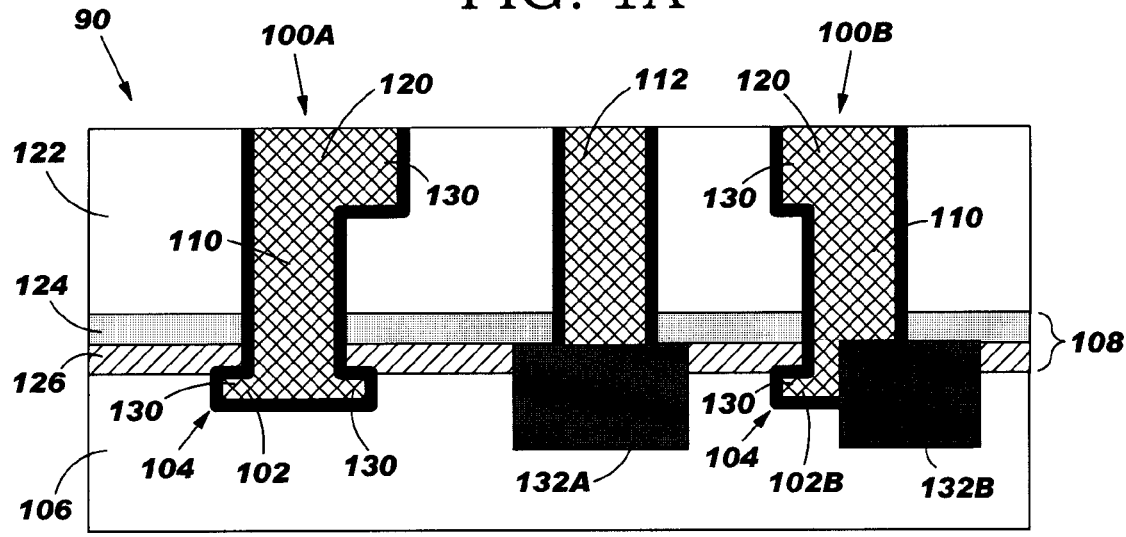
FIGS. 1A–1B shows a cross-section and plan view, respectively, of an interlayer connector for preventing delamination of at least two layers of a semiconductor device according to the invention.
Figure 1B:
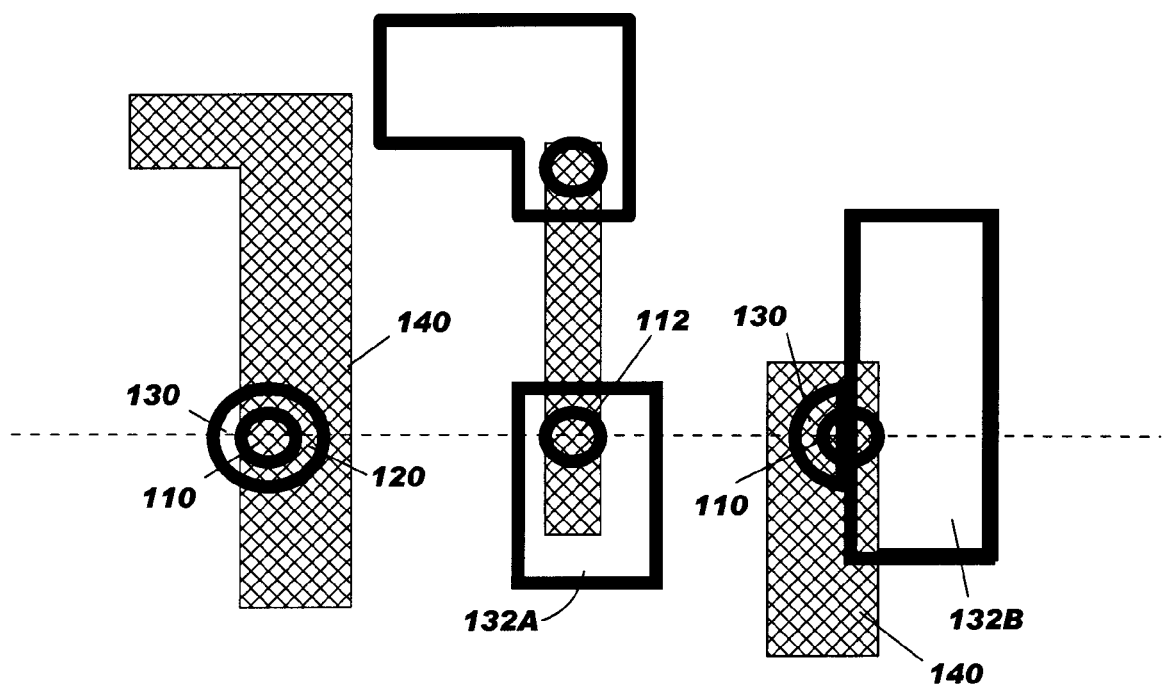

With reference to the accompanying drawings, FIG. 1A shows a cross-sectional view of a semiconductor device 90 including a number of interlayer connectors 100A, 100B (hereinafter "connectors") for preventing delamination of at least two layers of the semiconductor device according to the invention. FIG. 1B shows a plan view of the same structure. In the embodiment shown, semiconductor device 90 includes a first distal layer 106, at least one cover layer 108, and a second distal layer 122. It should be recognized, however, that device 90 may include practically any number of layers. A hard mask layer atop second distal layer 122 has been omitted for clarity purposes. Furthermore, the layers may include practically any material used in semiconductor fabrication, for example, dielectric material such as silicon dioxide ($SiO_2$), cap material such as silicon nitride (SiN) or silicon carbide (SiC), low-k dielectric material such as SiLK, Coral or Black Diamond, or metal such as copper (Cu) or aluminum (Al). In any event, connector 110 prevents delamination of the layers. As used herein, "distal layer" designates an uppermost or lowermost layer to which the connector is to be applied, and "cover layer" designates a cap layer 124 of, for example, silicon nitride (SiN), silicon carbide (SiC) or silicon-carbon-nitrogen (SiCN), or a hard mask layer 126. Hard mask layer 126 is substantially coplanar with an uppermost surface of damascene wires 132A, 132B. In the embodiments described herein, distal layer is described as a dielectric layer. It should be recognized, however, that a distal layer may also be a metal layer, if desired.

Each connector 100A, 100B includes: a first connector head 102 located in a dielectric area 104 of first distal layer 106 of the at least two layers of semiconductor device 90, a connector body 110 coupled to first connector head 102, and a second connector head 120 coupled to connector body 110 and located in second distal layer 122 of the at least two layers of semiconductor device 90. As illustrated, each connector head 102, 120 includes a portion 130 that extends laterally beyond connector body 110, which prevents layers 106, 108 and 120 from being pulled apart. In one embodiment, first connector head 102 undercuts cover layers 108 (i.e., extends laterally beyond connector body 110), and second connector head 120 includes a portion that overhangs (i.e., extends laterally beyond) connector body 110.

In one embodiment, as shown on the left side of FIGS. 1A–1B, a connector 100A can be formed such that it is electrically isolated from current-carrying wiring 132A, 132B. That is, connector 100A provides no other function than as interlayer connectors. Alternatively, as shown on the right side of FIGS. 1A–1B, a connector 100B can be partially landed on a current-carrying wire 132 in first distal layer 106, and may include a metal so as to provide a contact via. In this case, the partial landing on current-carrying wire 132B allows formation of first connector head 102B as an undercut to cover layers 108, which prevents connector head 102B from being pulled out of first distal layer 106. A conventional fully-landed dual damascene via 112 to wire 132A is shown in the center of FIGS. 1A–1B. Connectors 100A and 100B can be formed independently or in a single step, as will be described further below. Connector 100A can be formed as part of an active wire or as a pure dummy connector (isolated from active wires). Similarly, connector 100B can be formed as part of an active wire with via 110 that also functions as a connector head, or connector 100B can be formed as a pure dummy connector.

Figure 2:
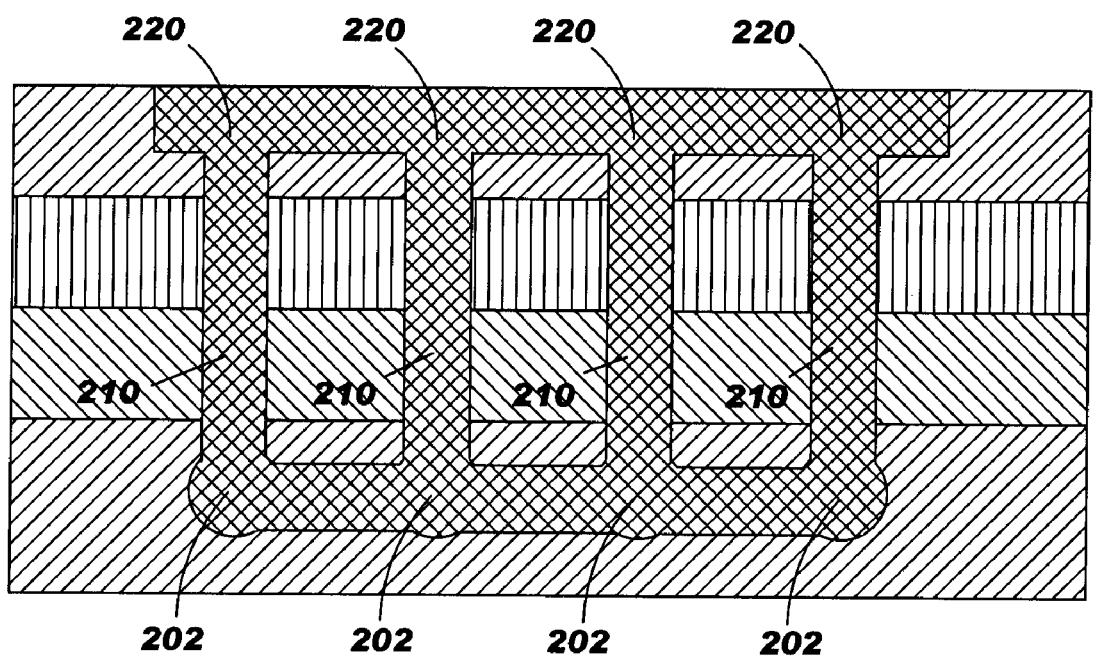
FIG. 2 shows an alternative embodiment of interlayer connectors.

As shown in FIG. 2, in an alternative embodiment, for, e.g., a device edge seal, a plurality of first connector heads 202 can be provided that are substantially or completely contiguous. In addition, a plurality of second connector heads 220 can be provided that are substantially or completely contiguous. A plurality of connector bodies 210 may be provided to couple the plurality of first connector heads 202 to plurality of second connector heads 220 provides structural rigidity (e.g., that prevents delamination along a device edge seal). The FIG. 2 embodiment could also be extended to be a multiple vertically-stacked ladder structure (not shown) sharing the rails and staggering rungs across multiple layers.

Turning to FIGS. 3–8, a first embodiment of a method of forming connector 100A, 100B for use in semiconductor device 90 will now be described. In general, the method includes a first step of forming an opening for generation of an interlayer connector, and then filling the opening. It should be recognized that the center part of FIGS. 3–8 illustrate formation of conventional dual damascene via 112 (FIG. 1) to wire 132A and wires 140 (FIG. 1B only), which may be formed simultaneously with connectors 100A, 100B of the invention. That is, interlayer connector 100A, 100B may be formed simultaneously with via 112 and wires 140, as shown in FIG. 1B. Connector head areas 158A, 158B (FIGS. 3–6) of an interlayer connectors 100A, 100B may connect to a via 112 or a wire 140.

In a first step, as shown in FIGS. 3–6, at least one opening 150A, 150B is formed. As will become more apparent, openings 150A, 150B can either land on device areas with no wires below or partially on wires below. As shown in FIG. 6 only, each opening 150A, 150B ultimately includes a main body 152A, 152B, a first connector head area 154A, 154B in dielectric area 104 of first distal layer 106 and a second connector head area 158A, 158B in second distal layer 122. Second connector head area 158A, 158B may also act as damascene wires 140 (FIG. 1B), and opening 152B can act as an active via. Each first connector head area 154A, 154B includes at least one portion 160 that extends laterally beyond main body 152A, 152B. Similarly, each second connector head area 158A, 158B includes at least one portion 162 that extends laterally beyond main body 152A, 152B. Main body 152A, 152B extends through any intermediate overlying layers. In one embodiment, overlying layers include cover layers 108 of first distal layer 106 such as a cap layer 124 or a hard mask layer 126, which may include one or more of silicon carbide (SiC), silicon-carbon-nitrogen (SiCN), hydrogenated silicon oxycarbide (SiCOH), silicon dioxide ($SiO_2$), silicon nitride (SiN), etc. Along with formation of openings 150A, 150B for formation of interlayer connectors 100 (FIG. 1), other opening(s) 150C each including a main body 152C may be formed for constructing conventional fully-landed dual damascene vias 112 (FIG. 1).

Figure 3:
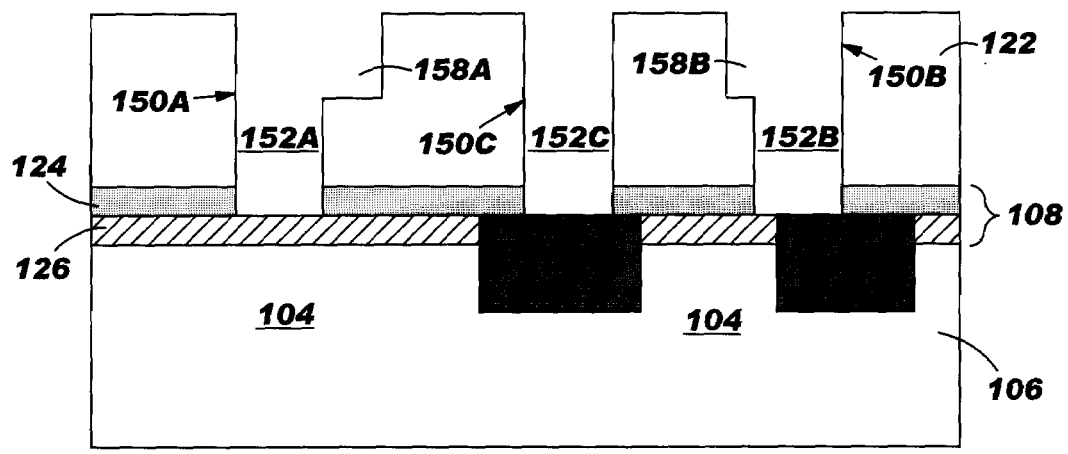
Figure 4:
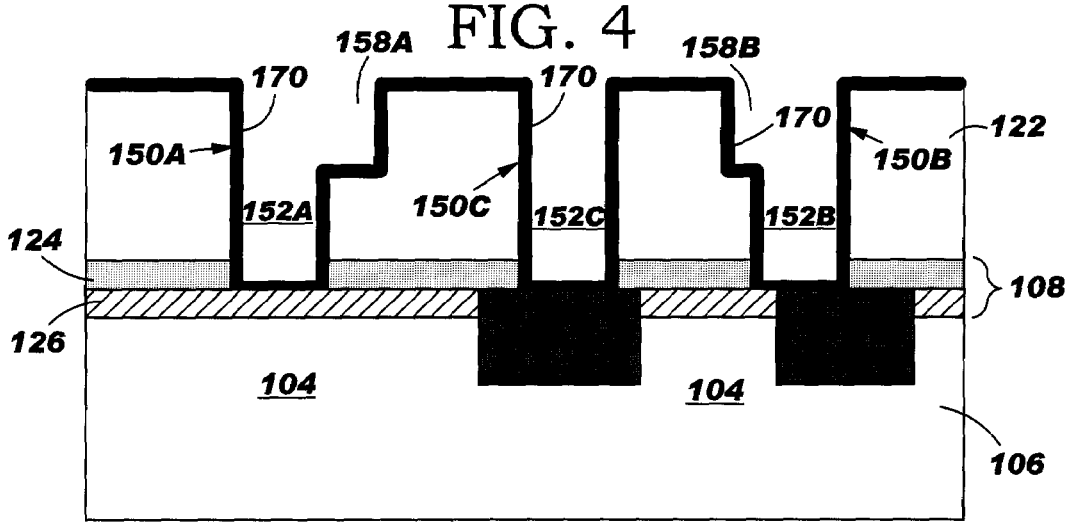
Figure 5:
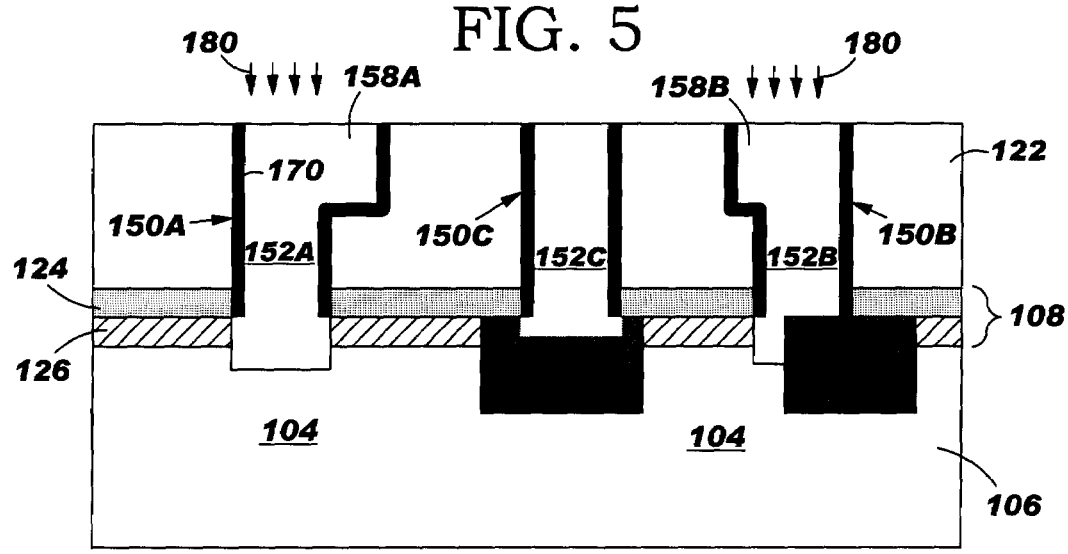

Returning to FIGS. 3–5, details of one embodiment of forming openings 150A, 150B will now be discussed. In FIG. 3, formation of each opening 150A–C may be initiated by conducting one or more depositions and dual damascene patterning of a photoresist mask (not shown) and etching to form main bodies 152A–C in layers 122, 124, and second connector head areas 158A, 158B, as known in the art. In this step, cap layer 124 is opened. In FIG. 4, an optional thin (1–50 nm) liner 170 composed of, for example, one or more layers of tantalum-nitride (TaN)(preferred), titanium-nitride (TiN), tungsten-nitride (WN), tantalum (Ta), tungsten or other liner material is deposited. The deposition may use, for example, physical vapor deposition (PVD), ionized PVD, self-ionized plasma (SIP), chemical vapor deposition (CVD), atomic layer deposition (ALD), etc., as known in the art. In FIG. 5, an etching to remove liner 170 from flat wafer surfaces and remove hard mask 124 at the bottom of openings 150A–150C is conducted. The etching may include a sputter etchback or any anisotropic etch, and may be performed in situ during layer 170 deposition (preferred). Next, layer 126 at the bottom of openings 152A, 152B is etched either as part of the etching of layer 170 or as a separate etching or sputtering step.

In a next step, shown in FIG. 6, a first connector head area 154A, 154B is formed in first distal layer 106 such that each area 154A, 154B extends laterally beyond main body 152A, 152B. In the embodiment shown, each first connector head area 154A, 154B undercuts at least one cover layer 108 positioned over first distal layer 106. This step may include conducting an isotropic etch, preferably in-situ in the sputter etchback chamber immediately after the sputter etchback is complete. That is, before any liner/seed/plating deposition used for metallization of the wires and vias occurs. If the dielectric to be etched is silicon-based, such as SiCOH or porous SiCOH, the etch may include, for example, a short diluted hydrofluoric acid (DHF)(e.g., 100:$1H_2O$:HF) wet etch. This isotropic etch would preferentially etch: first distal layer 106 (i.e., dielectric area 104 thereof) forming an undercut of hard mask 126 or hard mask 126 forming an undercut, or a combination thereof. To achieve lateral etching of hard mask 126, an etch selective to dielectric area 104 and other exposed hard masks 126 is employed. For example, if dielectric area 104 includes a low-k material such as SiLK, plasma etching containing one or more of hydrogen ($H_2$), argon (Ar), oxygen ($O_2$) or nitrogen ($N_2$), etc., plasma, as known in the art, may be employed to laterally etch. If alternating hard mask materials are used, mutually exclusive etch processes between levels may be employed.

In some circumstances, special processing may be necessary to adequately form first and second connector head areas 154A, 154B, 158A, 158B. For example, in the case that dielectric area 104 includes SiCOH, etching to form areas 154A, 154B is difficult. In particular, SiCOH has a low etch rate of approximately 7 Angstroms/minute (Ang/min), for example, using a diluted hydro-fluoric acid (DHF) solution. In order to address this problem, in an alternative embodiment shown in FIG. 5, an oxidization 180 may be applied to openings 150A, 150B to convert the SiCOH to a more silicon-oxide-like material to increase an etch rate thereof, i.e., the etch rate of SiO in the same DHF solution is approximately 20–25 Ang/min. In addition, where second distal layer 122 includes SiCOH, this layer must be passivated or lined to protect it from the oxidative plasma, which could cause blowout in openings 150A, 150B in second distal layer 122. In this case, a protective layer may be provided in openings 150A, 150B. The protective layer would be incident with the previously described liner 170, shown in FIG. 5, and may be provided as any material capable of protecting layer 122 from the oxidation. In one embodiment, the protective layer may be provided as the previously described liner material. Alternatively, a polymer deposition could be performed at the end of a reactive ion etch (RIE) process shown in FIG. 3 by using a plasma, e.g., a $CF_4$ rich plasma, to line and protect openings 150A, 150B in second distal layer 122 during the oxidation step.

In an alternative embodiment, an additional thin-film sub layer (not shown) may be employed, which might also double as an adhesion improvement layer for a subsequent layer, and also as an etch stop for chemical mechanical polishing (CMP) process that removes a hardmask.

It should be recognized that certain dielectric materials (e.g., layers 106, 122 in FIG. 1A)(e.g., CVD $SiO_x$ or TEOS) that may not require the above-described special processing may be used. However, these materials also present a higher dielectric constant, and thus are not the most desirable of materials. Other more desirable dielectric materials, other than SiCOH, include spin-on dielectrics such as methyl silsesquioxane (MSQ) available from JSR Corp., hydrogen silsesquioxane (HSQ)™ available from Dow Corning, or chemical vapor deposited (CVD) SiCOH materials, SiLK™ from Dow Chemical or porous SiLK™.

In the case that the FIG. 2 embodiment is to be constructed, the opening forming step may include interconnecting at least two of the first connector head areas 154A, 154B, and/or interconnecting at least two of second connector head areas 158A, 158B.

Returning to FIG. 1A in conjunction with FIG. 6, as indicated above, one feature of the invention is that interlayer connectors 100A, 100B eliminate the need for white space fill above and below conventional via fill because connectors 100A, 100B are coplanar with the on device wiring 132A, 132B. That is, as shown in FIG. 6, openings 150A, 150B can either land on device areas with no wires below or partially on wires below, which provides a number of options in forming interlayer connectors 100A, 100B. For example, a main body 152B (FIG. 6) may be partially landed on a wire 132B in first distal layer 106. In this case, first connector head area 154B is formed from a non-landed part of main body 152B. Where wire 132B is a current-carrying wire, an interlayer connector 100B formed from opening 150B may partly form a contact via when a metal is deposited in opening 150B, and partly form an irremovable connector. That is, interlayer connector 100B prevents delamination and may also acts as a contact via to a current-carrying wire 132B. In this case, second connector head 120 is also an active current-carrying wire. Alternatively, where wire 132B is not a current-carrying wire (i.e., a dummy wire), interlayer connector 100B may simply provide an irremovable connector formed either by depositing a dielectric or a metal. In the later case, the metal is preferably of the same makeup as wire 132B. In embodiments where wire 132B is a dummy wire, second connector head 120 may be any shape (e.g., a bolt or a bar shape) that is larger than the diameter of connector body 110. Where no wire is located below a main body 152A, first connector head area 154A may be formed anywhere about the bottom of main body 152A. In this case, second connector head 120 is inactive, but may be sized to provide any necessary amount of fill. Fill material for opening 150A may be dielectric or metal.

With continuing reference to FIGS. 1A and 6, it should be recognized that while particular embodiment for forming openings 150A, 150B have been described above, they may be formed using a dual damascene wiring using any known method, with the additional placement of interlayer connector openings in the via masks where they will fit. Alternatively, openings 150A, 150B may be provided with any single damascene process for vias only, i.e., without formation of opening 150C. The opening forming step may be provided as part of forming contact via 112 (FIG. 1)(from opening 150C) or fill structures (not shown), e.g., wire fill or conventional via fill. The number of openings 150A, 150B that ultimately form connectors 100A, 100B can be user defined based, for example, on the amount of available space, the amount of delamination protection desired, etc.

Turning to FIG. 7, a second step of the method includes filling each opening 150A, 150B to form an interlayer connector 100A, 100B. This step may include depositing a metal or a dielectric 180 including any necessary liner materials (not shown). In terms of the former, the metal may be any desired metal where opening 150A does not land on a wire 132. If the opening 150B partially lands on an opening, then the metal is preferably the same makeup as the wire 132. Where the wire is copper, conventional liner material (e.g., one or more of TaN, WN, TiN, RuN, TaSiN, etc.), seed material (preferably Cu or Al) and copper (Cu) plating depositions may be conducted. Note that a conformal liner process, preferably chemical vapor deposition (CVD) or physical vapor deposition (PVD) with good step coverage in overhang structures is preferred, but not required. Optional CVD Cu deposition for seed, plating, or both could be employed to maximize metal fill of opening 150B bottoms. A dielectric material may be used where interlayer connector 100A does not to also function as a contact via. In terms of dielectric liner material, the material may include any dielectric having sufficient strength to withstand the expected delaminating stresses, such as silicon dioxide ($SiO_2$) deposited using a conformal plasma enhance CVD (PECVD), sub-atmospheric CVD (SCVD), atmospheric CVD (ACVD), thermal CVD (THCVD) or a spin-on process. Subsequent processing, as shown in FIG. 8, may include customary finishing steps such as chemical mechanical polishing (CMP), reactive ion etching (RIE) or wet etchback, or a combination of above, to remove the excess liner, metal, dielectric, etc., from the wafer surface.

Figure 9:
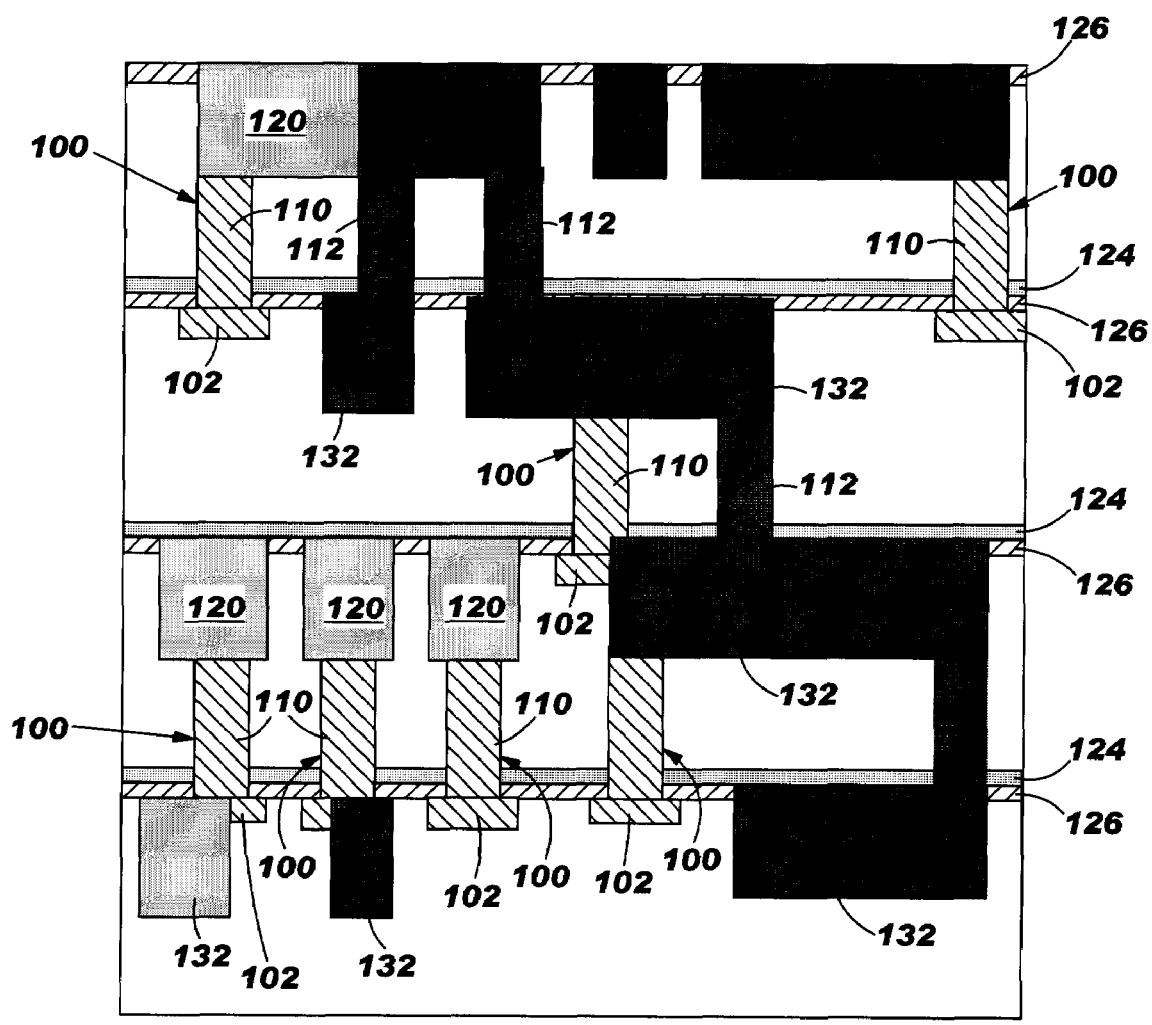
FIG. 9 shows interlayer connectors of FIG. 1 applied across multiple wiring levels of a semiconductor device.

FIG. 9 illustrates application of the present invention across a plurality of wiring levels of a semiconductor device. In FIG. 9, current-carrying wires are indicated in black, and dummy wiring is indicated in gray. It should be recognized that main bodies 110 and connector heads 102, although shown as separate parts, are actually integrally formed.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An interlayer connector for preventing delamination of at least two layers of a semiconductor device, the connector comprising:
   a first connector head located in a dielectric area of a first distal layer of the at least two layers of the semiconductor device;
   a connector body coupled to the first connector head; and
   a second connector head coupled to the connector body and located in a second distal layer of the at least two layers of the semiconductor device;
   wherein the first and second connector head each include at least one portion that extends laterally beyond the connector body;
   wherein the first connector head is partially landed on a current-carrying wire in the first distal layer, and includes at least one portion that extends laterally beyond the connector body in the direction of the current carrying wire, and at least one portion that extends laterally beyond the connector body in the direction away from the current carrying wire; and
   wherein the connector heads and connector body include a metal so as to provide a contact via to the current-carrying wire.

2. The connector of claim 1, wherein the first and the second connector bead are substantially circular.

3. The connector of claim 1, wherein the second connector head is part of a current-carrying wire.

4. The connector of claim 1, further comprising a plurality of first connector heads that are substantially contiguous, a plurality of second connector heads that are substantially contiguous, and a plurality of connector bodies coupling the plurality of first connector heads to the plurality of second connector heads.

5. The connector of claim 1, wherein the first and second connector heads and the connector body form a single, integral interlayer connector.

* * * * *